United States Patent [19]
Izume et al.

[11] Patent Number: 5,285,888
[45] Date of Patent: Feb. 15, 1994

[54] PARTS MOUNTING APPARATUS

[75] Inventors: Takatomo Izume, Urawa; Shuji Sato, Yokkaichi; Shingo Sekiguchi, Hachiohji; Katasuga Sano, Kuwana; Hisao Suzuki; Kazuhiro Tokitu, both of Tokyo, all of Japan

[73] Assignee: Kabushiki Kaisha Toshiba, Kanagawa, Japan

[21] Appl. No.: 949,899

[22] Filed: Sep. 23, 1992

[30] Foreign Application Priority Data

Sep. 25, 1991 [JP] Japan ............... 3-245906
Sep. 25, 1991 [JP] Japan ............... 3-245907

[51] Int. Cl.⁵ ............................................. B65G 17/46
[52] U.S. Cl. ............................ 198/471.1; 29/720; 29/739; 29/743; 198/341; 198/464.3
[58] Field of Search ................. 198/341, 463.2, 464.3, 198/471.1, 470.1, 474.1; 29/720, 721, 739, 740, 743, 785

[56] References Cited

U.S. PATENT DOCUMENTS

| | | | |
|---|---|---|---|
| 4,157,206 | 6/1979 | Ikeda et al. | 198/341 X |
| 4,793,707 | 12/1988 | Hata et al. | 29/759 X |
| 4,809,430 | 3/1989 | Maruyama et al. | 29/834 |
| 4,951,388 | 8/1990 | Eguchi et al. | 29/740 X |
| 5,086,556 | 2/1992 | Toi | 29/720 X |
| 5,177,864 | 1/1993 | Oyama | 29/720 X |

FOREIGN PATENT DOCUMENTS

| | | | |
|---|---|---|---|
| 0371205A2 | 6/1990 | European Pat. Off. | H01L 21/00 |
| 0401808A1 | 12/1990 | European Pat. Off. | H05K 13/00 |
| 0424641A1 | 5/1991 | European Pat. Off. | H05K 13/04 |

OTHER PUBLICATIONS

IBM Technical Disclosure Bulletin, vol. 31, No. 2, Jul. 1988.

*Primary Examiner*—James R. Bidwell
*Attorney, Agent, or Firm*—Limbach & Limbach

[57] ABSTRACT

In a parts mounting apparatus, a suction nozzle is caused to perform a cycloid movement. A part such as an electronic part is sucked into the nozzle at one of bottom dead points of the cycloid movement and mounted onto another component such as a circuit substrate at the other or another bottom dead point. In compensation of the position of the nozzle at the bottom dead point, the nozzle is also caused to perform the cycloid movement. The position of the nozzle at the bottom dead point is monitored by a monitoring camera so that an amount of deviation of the position of the nozzle from the bottom dead point is obtained. The phase of the cycloid movement is compensated so that the amount of deviation of the nozzle is rendered zero. Alternatively, the part sucked in the nozzle positioned at the bottom dead point is monitored by the monitoring camera.

13 Claims, 12 Drawing Sheets

PARTS MOUNTING APPARATUS

BACKGROUND OF THE INVENTION

1. Field of the Invention

This invention relates to a parts mounting device wherein a suction and mounting nozzle performs a cycloid movement so that a high speed mounting of parts can be provided.

2. Description of the prior art

In one of conventional high-speed parts mounting apparatus, suction and mounting nozzles are mounted on an outer periphery of a rotating table to be vertically movable. Each nozzle is moved from a parts suction station to a parts mounting station with rotation of the rotating table. The rotating table is temporally stopped and each nozzle is lowered or raised at each station so that parts are sucked by the nozzles at the parts suction station and the parts are mounted on circuit substrates, for example, at the parts mounting station.

According to the above-described construction, the movement of the rotating table is intermittent and accordingly, the operation of each nozzle at each station is intermittent in a sequence of lowering, stop (suction or mounting), raising and stop (standby). The operation of the whole apparatus is thus intermittent, which is one of causes for interrupting the high-speed parts mounting work.

The assignees have jointly developed a parts mounting apparatus wherein the above-described intermittent movement of the apparatus has been changed to a continuous movement so that a high-speed mounting work can be performed. In the developed apparatus, suction and mounting nozzles are mounted on the outer periphery of a rotating carrier rotated in a horizontal direction so that the nozzles are turned in a vertical direction. With rotation of the rotating carrier, each nozzle is turned along the outer periphery of the carrier in the state that each nozzle is directed downward. In this construction, each nozzle performs a cycloid movement in the direction of the outer periphery of the rotating carrier with its rotation. The cycloid movement of each nozzle has a plurality of bottom dead points. A part is sucked in the distal end of the nozzle when the nozzle reaches predetermined one of the bottom dead points corresponding to a part sucking stage and the suction is released when the nozzle reaches another predetermined bottom dead point corresponding to a part mounting stage so that the part is mounted on the circuit substrate.

In the apparatus utilizing the cycloid movement, however, a mounting error and a dimensional error of the nozzle, an error in setting return to origin and the like cause errors in the position of the nozzle at part sucking and mounting points or the position of the nozzle when it reaches the bottom dead point in the cycloid movement. The part is not sucked by the nozzle or is improperly mounted on the substrate when the errors in the position of the nozzle at the part sucking and mounting points are increased. Accordingly, the errors need to be compensated so that the precision in the part sucking and mounting positions of the nozzle can be secured.

It has been proposed that the rotating carrier be stopped so that the positional errors of the nozzle at the bottom dead point are compensated, as in the same manner in the conventional parts mounting apparatus. However, in the apparatus utilizing the cycloid movement, a number of gears are employed in a transmission system for the cycloid movement of the nozzle. Consequently, even when the position of the nozzle is compensated in the state that the rotating carrier is stopped, the position of the nozzle is deviated during the operation from the compensated one by a cumulative error due to some play in the gears of the transmission system. Accordingly, it is difficult to precisely compensate the position of the nozzle at the bottom dead point in the state that the parts mounting apparatus is deenergized. The position of the nozzle at the bottom dead point during the cycloid movement needs to be precisely compensated.

SUMMARY OF THE INVENTION

Therefore, an object of the present invention is to provide a parts mounting apparatus wherein the nozzle performs the cycloid movement and the position of the nozzle at the bottom dead point in the cycloid movement can be precisely compensated.

In one aspect of the present invention, a parts mounting apparatus comprises a rotating carrier having a reference plane and rotated about a rotational shaft perpendicular to the reference plane. A suction nozzle is mounted on an outer periphery of the rotating carrier to be turned in a direction intersecting substantially perpendicularly to the reference plane. The nozzle performs a cycloid movement when turned with rotation of the rotating carrier. The nozzle has a distal end having a plurality of bottom dead points in the cycloid movement. Control means is provided for controlling the nozzle so that the nozzle performs a suction operation in which a part is sucked into the distal end of the nozzle, when the distal end of the nozzle reaches predetermined one of the bottom dead points and so that the nozzle releases the suction operation when the distal end of the nozzle reaches the other or another predetermined bottom dead point. A monitoring camera is provided for monitoring the distal end of the nozzle positioned at the bottom dead point during the cycloid movement of the nozzle. Operating means is provided for obtaining an amount of deviation of the distal end of the nozzle from the bottom dead point from output information from the monitoring camera. Compensation means is provided for compensating a phase of the cycloid movement so that the amount of deviation of the distal end of the nozzle from the bottom dead point is zeroed.

In accordance with the above-described apparatus, the rotating carrier is rotated about the rotational shaft perpendicular to the reference plane in the parts mounting work so that the nozzle is turned along the outer periphery of the rotating carrier. Consequently, the nozzle performs the cycloid movement in the direction of the outer periphery of the carrier. The part is sucked in the distal end of the nozzle when the nozzle reaches the predetermined bottom dead point in the cycloid movement. The suction is released when the nozzle reaches the other or another predetermined bottom dead point, so that the part is mounted on the circuit substrate, for example.

In compensation of the position of the nozzle at the bottom dead point, the rotating carrier is driven so that the nozzle performs the cycloid movement, in the same manner as in the actual parts mounting work. Then, the monitoring camera is operated to monitor the position of the nozzle at the bottom dead point. The operating means then obtains the amount of deviation of the distal end of the nozzle from the bottom dead point from the output information from the monitoring camera. The phase of the cycloid movement of the nozzle is compensated by the compensation means so that the amount of deviation of the distal end of the nozzle from the bottom dead point is zeroed.

In another aspect, in the above-described construction, a monitoring camera is provided for monitoring the part sucked in the distal end of the nozzle positioned at the bottom dead point during the cycloid movement. Operating means is provided for obtaining an amount of deviation of the part sucked in the distal end of the nozzle from the bottom dead point from output information from the monitoring camera. Compensation means is provided for compensating a phase of the cycloid movement so that the amount of deviation of the distal end of the nozzle from the bottom dead point is zeroed.

The apparatus may further comprise diffuse reflection means provided on an upper distal end of the nozzle for reflecting an incident light with predetermined diffusely directional characteristic and a light source provided for projecting light onto the diffuse reflection means and positioned so that an effective reflected light having a large reflective intensity out of the light reflected by the diffuse reflection means is allowed to enter the monitoring camera.

In accordance with the above-described construction, the light from the light source is diffusely reflected with the predetermined diffusely directional characteristic by the diffuse reflection means. The light reflected by the diffuse reflection means can efficiently enter the monitoring camera since the light source is positioned so that the effective reflected light having a large reflective intensity out of the light reflected by the diffuse reflection means is allowed to enter the monitoring camera. Consequently, an image of the part sucked in the distal end of the nozzle can be precisely picked up.

Other objects of the present invention will become obvious upon understanding of the illustrative embodiments about to be described. Various advantages not referred to herein will occur to one skilled in the art upon employment of the invention in practice.

BRIEF DESCRIPTION OF THE DRAWINGS

Embodiments of the present invention will be described with reference to the accompanying drawings in which.

DESCRIPTION OF THE PREFERRED EMBODIMENTS

Figure 1:
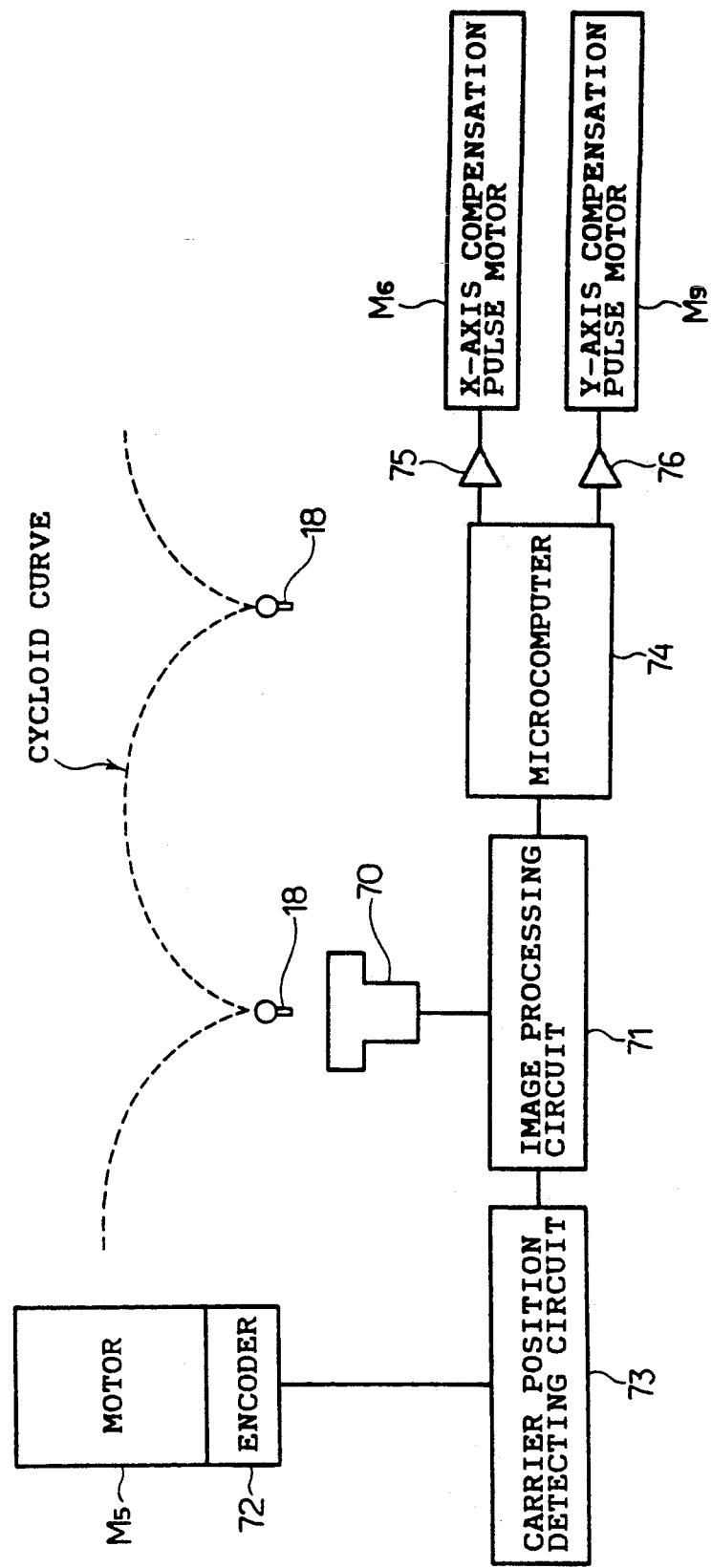
FIG. 1 is a block diagram of the control system for compensating the position of the nozzle at the bottom dead point, which system is employed in the parts mounting apparatus of a first embodiment.
Figure 2:
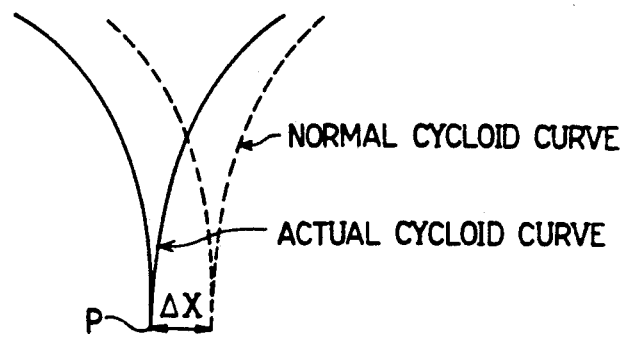
FIG. 2 is a front view of the monitoring camera showing the positional relation between the monitoring camera and the position of the nozzle at the bottom dead point.
Figure 2:
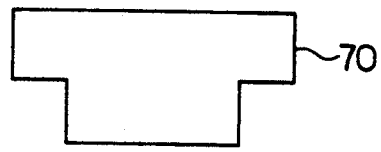
Figure 3:
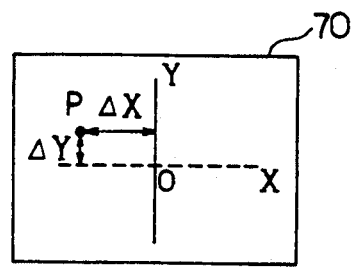
FIG. 3 shows an image plane of the monitoring camera.

A first embodiment of the present invention will be described with reference to FIGS. 1 through 11. First, the mechanical construction of the parts mounting apparatus will be described with reference to FIGS. 5–10. Referring to FIG. 5, a rotating carrier 3 is mounted on a main frame 1 to be rotated about a carrier shaft 2 vertically extending and perpendicular to a reference plane set in a horizontal direction. A suction station 4 is provided around the rotating carrier 3 and a mounting station 5 is provided around the carrier 3 so as to be spaced from the suction station 4. The suction station 4 is formed into the shape of an arc around the rotating carrier 3 and electronic parts 7, for example, are fed to a predetermined suction position by a feeder 6.

An X-Y table 8 is disposed in the mounting station 5. The table 8 is moved by a first motor M1a in the longitudinal directions or in the directions of arrow A, as viewed in FIG. 5. The table 8 is also moved by a motor M1b in the transverse directions or in the directions of arrow B, as viewed in FIG. 5. A mounting conveyor 9 is provided on the upper face of the table 8. The conveyor 9 is moved by a second motor M2 horizontally in the direction of arrow C. A feed-in conveyor 10 driven by a third motor M3 and a feed-out conveyor 11 driven by a fourth motor M4 are provided at the right-hand and left-hand sides of the conveyor 9 respectively. Circuit substrates 12 are carried by the feed-in conveyor 10 in the direction of arrow D. Then, the table 8 is moved to the right and the substrates 12 on the feed-in conveyor 10 are loaded onto the conveyor 9 when the conveyor 9 gets close to the conveyor 10. The substrates 12 are carried by the conveyor 9 to the left or in the direction of arrow C. The table 8 is then moved to the left so that the conveyor 9 carrying the substrates 12 comes near the feed-out conveyor 11. The substrates 12 on the conveyor 9 are loaded onto the conveyor 11 when the conveyor 9 gets close to the conveyor 11.

Figure 8:
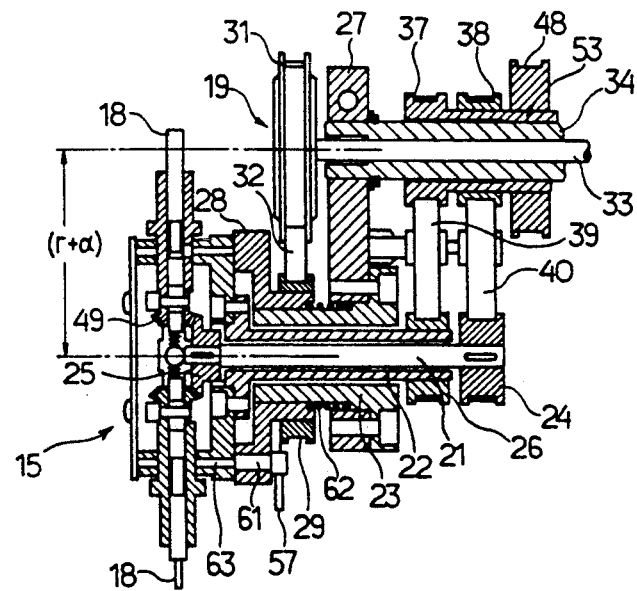
FIG. 8 is a sectional view of the mounting head and its peripheral portion.
Figure 9:
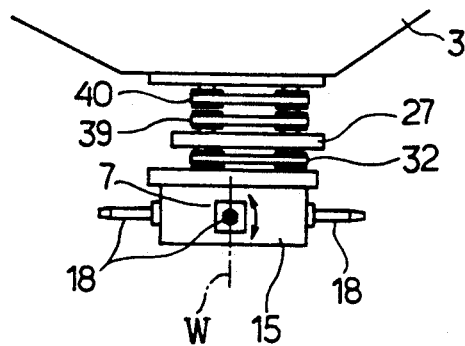
FIG. 9 is a plan view of the mounting head and its peripheral portion.
Figure 10:
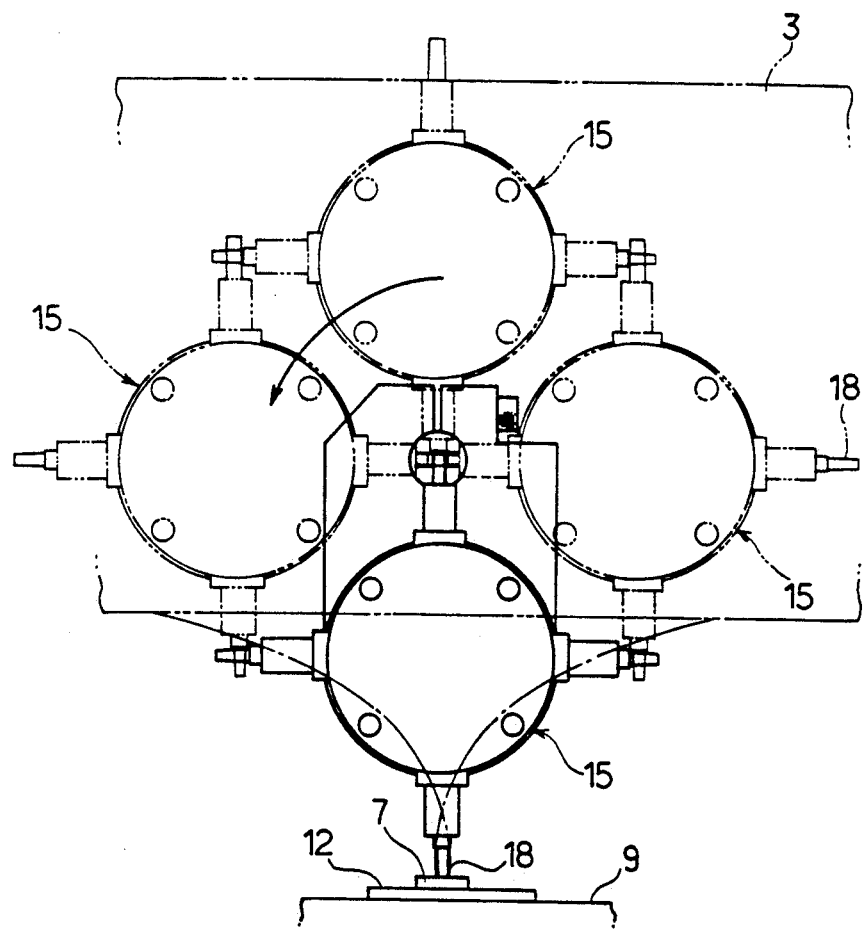
FIG. 10 is a plan view of the mounting head for explaining its operation.
Figure 11:
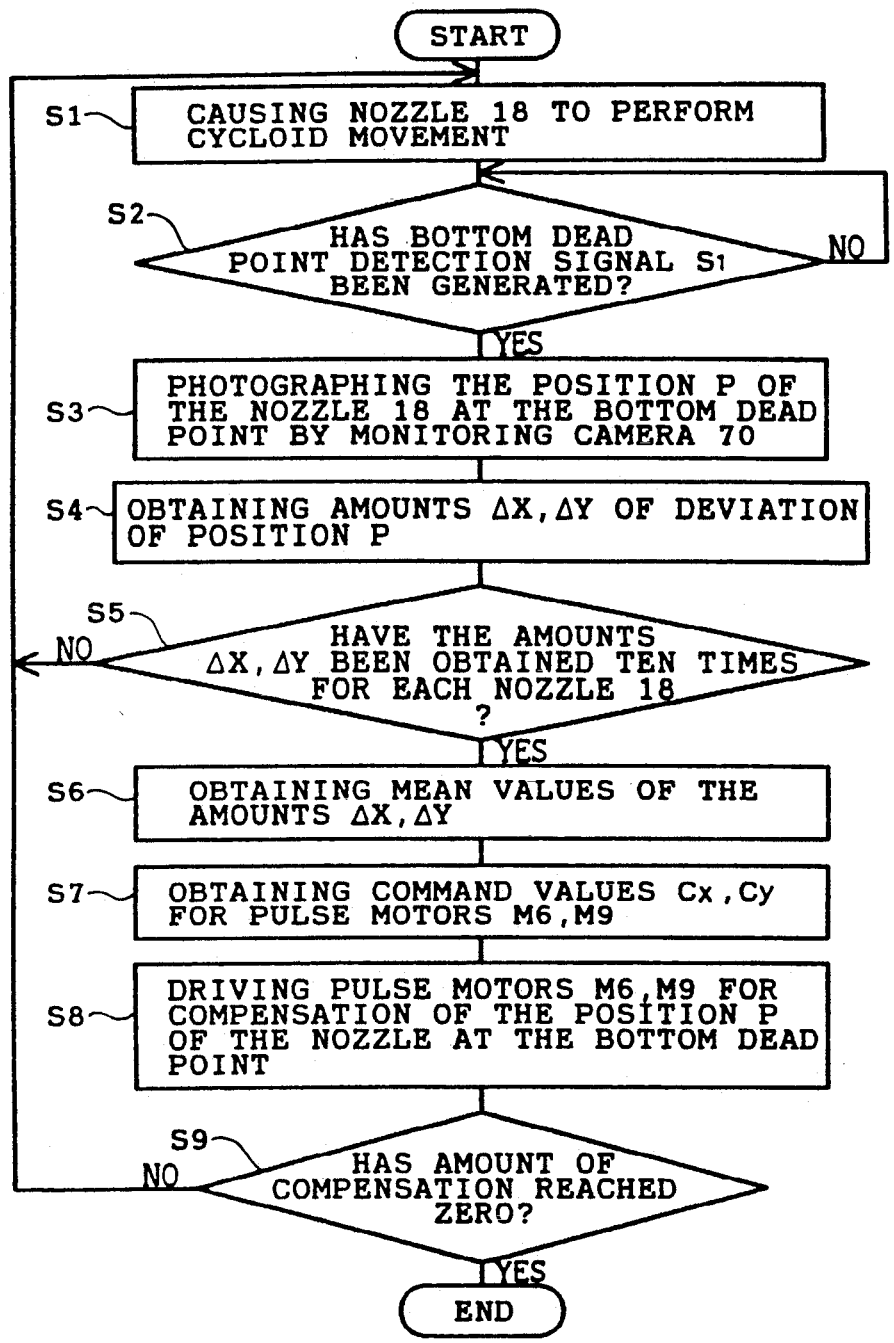
FIG. 11 is a flowchart for explaining the control for the compensation of the position of the nozzle at the bottom dead point.

The carrier 3 is continuously rotated in the clockwise direction or in the direction of arrow E about a carrier shaft 2 via a belt 13 and a gear mechanism 14 by a fifth motor M5. A plurality of mounting heads 15 are provided on the outer periphery of the carrier 3 with equal intervals. Each head 15 is rotated about a shaft extending radially of the carrier 3. Four suction nozzles 18 having different sizes from one another are mounted radially at the intervals of 90 degrees on the outer periphery of each mounting head 15, as is shown in FIGS. 9 and 10. Each suction nozzle 18 is turned about a fixed link shaft 33, maintained in the same attitude by a head attitude control mechanism 19 as shown in FIG. 8. The head attitude control mechanism 19 has first, second and third shafts 21, 22 and 23. A nozzle driving pulley 24 is coupled to one of two ends of the first shaft 21. A side gear 25 is coupled to the other end of the first shaft 21. A pinion gear 49 mounted on the nozzle 18 is in mesh engagement with the side gear 25.

The second shaft 22 is rotatably provided outside the first shaft 21. The mounting head 15 is coupled to one of two ends of the second shaft 22 and a head driving pulley 26 is coupled to the other end of the second shaft 22. The third shaft 23 is rotatably provided outside the second shaft 22. One of two ends of the third shaft 23 is fitted in an end of a link 27. A disc 28 is secured to the other end of the third shaft 23. A pulley 29 is mounted on its trunk. The pulley 29 is coupled via a belt 32 to a final pulley 31 of a first power transmission path 30. The final pulley 31 of the first power transmission path 30 is secured to a central fixed link shaft 33 composing a quadruple shaft. The fixed link shaft 33 has one of two ends fixed to a sleeve shaft 34 fitted with the link 27 and the other end fixed to a support frame (not shown) further fixed to the carrier 3.

The nozzle driving pulley 24 and the mounting head driving pulley 26 are coupled via belts 39 and 40 to final pulleys 37 and 38 of second and third power transmission paths 36 and 36 respectively. Thus, the rotative power is transmitted to both final pulleys 37, 38 such that a planetary gear drive mechanism is provided wherein the mounting head 15 rotates, revolved about the fixed link shaft 33.

The mounting head 15 is set to rotate one turn per revolution in the embodiment. The pulleys 29, 26 and 24 and the final pulleys 31, 37 and 38 are set in the pulley ratios of 1:1 respectively. Consequently, the mounting head 15 is turned about the fixed link shaft 33 with the selected nozzle 18 maintained at the same attitude in which it is usually directed downwards.

Figure 6:
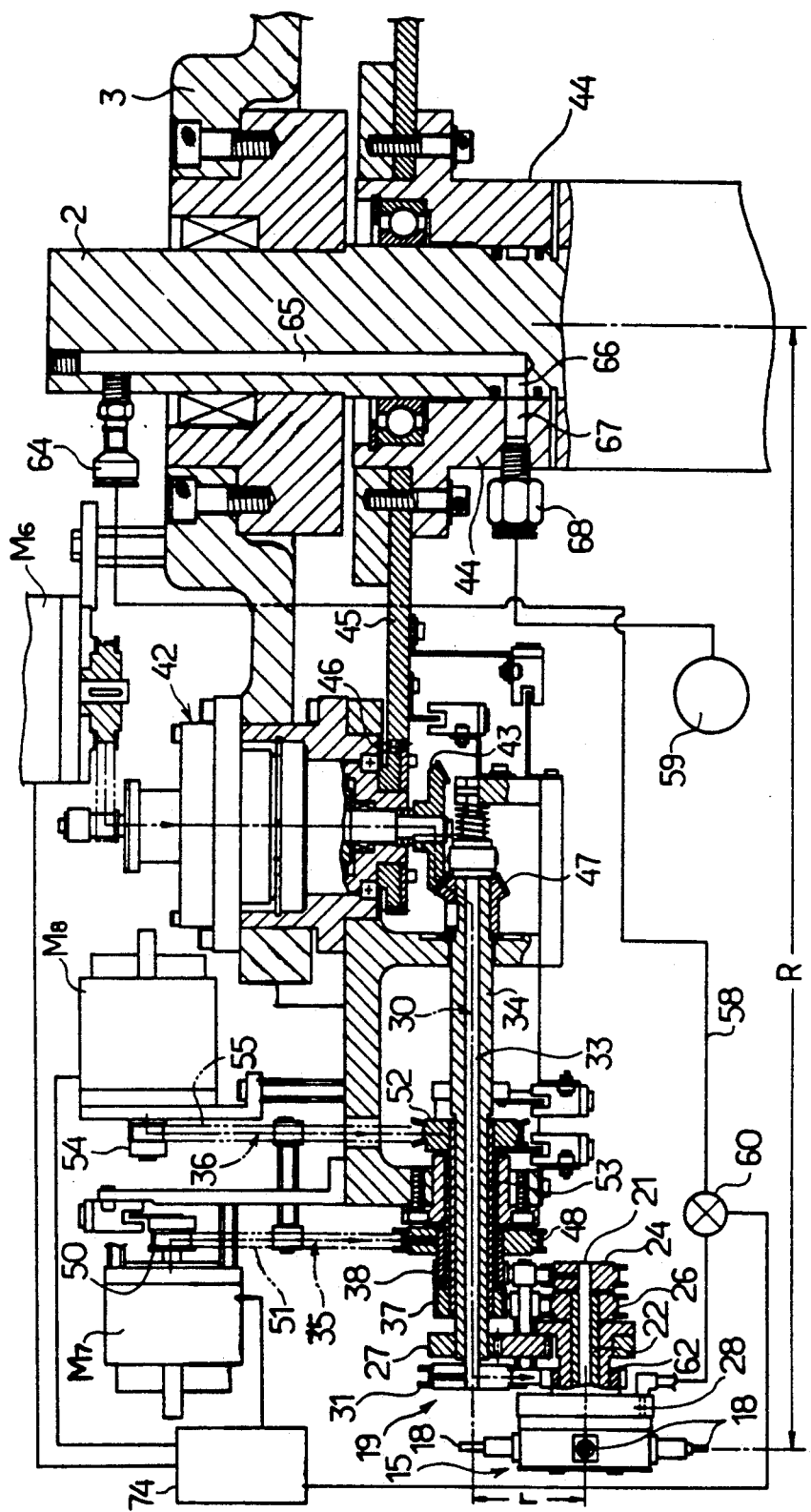
FIG. 6 is a sectional view of the power transmission system for the cycloid movement.
Figure 7:
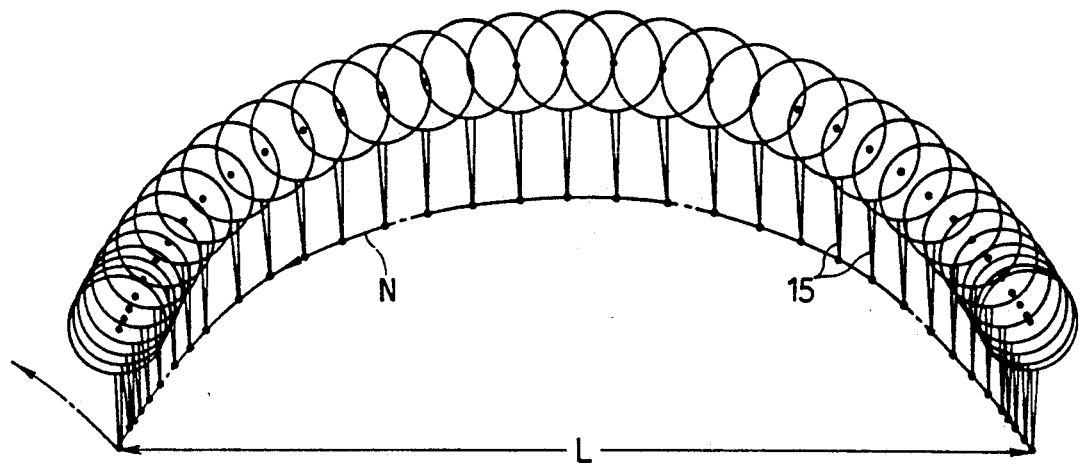
FIG. 7 shows a locus of the cycloid movement of the nozzle.

The above-described first power transmission path 30 is a power transmission system for the cycloid movement, as is shown in FIG. 6. The power from a sixth motor M6 mounted on the carrier 3 and the power from the carrier 3 are simultaneously transmitted via the first power transmission path 30 to this power transmission system via a differential gear mechanism 42. The ratio of the turning radius r of the mounting head 15 and the turning radius R of the carrier 3 is set to a normal cycloid ratio of 1:10 by which a normal cycloid movement is obtained. The turning radius r of the mounting head 15 is from the fixed link shaft 33 to the first shaft 21 and the turning radius R of the carrier 3 is from the drum shaft 2 to the nozzle 18.

The above-mentioned differential gear mechanism 42 is generally called harmonic reduction gears and mounted on the carrier 3. The differential gear mechanism 42 has both a power transmission mechanism for a motor power transmission system transmitting the power of the sixth motor M6 to an output bevel gear 43 and a power transmission mechanism for a carrier power transmission system transmitting the power of the carrier 3 to the bevel gear 43. In the latter, carrier power transmission system, a ring gear 45 secured to a fixed sleeve 44 is in mesh engagement with a transmission gear 46, which gear is revolved, turning around the ring gear 45 so that the rotative power of the carrier 3 is transmitted to the bevel gear 43.

The output bevel gear 43 extends through the fixed link shaft 33 and is in mesh engagement with a bevel gear 47 mounted on the sleeve shaft 34 which is a second shaft of the quadruple shaft. Accordingly, the transmission gear 46 is revolved, turning around the ring gear 45 when the carrier 3 is rotated in the direction of arrow E in the condition that the sixth motor M6 is deenergized. The rotative drive power of the transmission gear 46 is transmitted as the counterclockwise rotative power via the bevel gears 43, 47 to the sleeve shaft 34. Consequently, the lower end of the nozzle 18 of the mounting head 15 shows a locus such as a cycloid curve in FIG. 3.

The phase (cycle) of the cycloid movement can be compensated by the control of the motor M6 as follows. The nozzle 18 is set so as to be rotated about five turns in the counter-clockwise direction while it is moved from the suction station 4 to the table 8 by 180 degrees. When the motor M6 is operated for a time period corresponding to four turns of the nozzle 18, for example, the nozzle 18 performs the cycloid movement in which it draws such a cycloid curve that it is lowered two times during its movement about by 180 degrees. Accordingly, when the sixth motor M6 is controlled so that the number of turns of the nozzle 18 is changed to three or four and a half turns, the cycle L of the cycloid curve N can be rendered long or short. Thus, the adjustment of the length of the cycle L provides the adjustment of the phase of the cycloid movement such that the parts 7 can be picked up in the overall region of the suction station 4.

The second power transmission path 35 is a power transmission system for the attitude control of the parts 7. The power from a seventh motor M7 mounted on the carrier 3 is transmitted via an input pulley 48 to the nozzle driving pulley 24. The input pulley 48 is secured to the sleeve shaft 34 of the final pulley 38 which is a fourth shaft of the quadruple shaft and is coupled via a belt 51 to a pulley 50 of the seventh motor M7. Consequently, the rotative power of the seventh motor M7 is transmitted to the nozzle driving pulley 24 so that the nozzle 18 is rotated slightly in the clockwise or counterclockwise direction, as viewed in FIG. 9. As a result, the angle θ of the nozzle 18 can be corrected such that the attitude of the part 7 is controlled to be proper with respect to the reference line W. A charge coupled device (CCD) camera (not shown) is provided for monitoring the attitude of the part 7 sucked in the nozzle 18, for example.

The third power transmission path 36 is a power transmission system for selection of the nozzle 18. The rotative power of an eighth motor M8 is transmitted via an input pulley 52 to the mounting head driving pulley 26. The input pulley 52 is secured to a sleeve shaft 53 of the final pulley 37 which is a third shaft of the quadruple shaft. The input pulley 52 is further coupled via a belt 55 to a motor pulley 54 of the eighth motor M8. Consequently, the eighth motor M8 is controlled so that the mounting head 15 is rotated via the pulley 26 by 90, 180 or 270 degrees, whereby one of the four nozzles 18 is selected.

The production of the suction force by the nozzle 18 will now be described with reference to FIG. 6. The nozzle 18 is connected via an air pipe 58 to a vacuum source 59. A valve 60 provided in the air pipe 58 is controlled to be closed and opened so that the nozzle 18 is forced into the negative pressure condition, thereby producing the suction force.

The air pipe 58 and the valve 60 are supported so as to be rotated together with the carrier 3. As shown in FIG. 8, the distal end of the air pipe 58 is in contact with a communication aperture 61 formed in the disc 28 which is further in contact with the rear face of the mounting head 15. The communication aperture 61 is communicated to another communication aperture 63 which is further communicated to the nozzle 18 every time the disc 28 is pushed toward the side of the mounting head 15 by urging means such as a spring 62.

An upstream side of the air pipe 58 is connected to a joint 64 mounted on the lower side of the carrier shaft 2. The joint 64 is communicated to the vacuum source 59 via a communication path 65 formed in the interior of the carrier shaft 2. A ring-shaped communication groove 66 is formed in the lower end of the communication path 65. The communication groove 66 surrounds the carrier shaft 2 so that the communication between the groove 66 and an aperture 67 of the fixed sleeve 44 is usually maintained even when the carrier shaft 2 is rotated. The vacuum source 59 is connected via a joint 68 to the communication aperture 67 of the fixed sleeve 44.

The arrangement of the control system will now be described. A monitoring camera 70 is provided midway between the suction and mounting stations 4, 5 for monitoring the position of the nozzle 18 at the bottom dead point in the cycloid movement, from below it, as is shown in FIG. 1. An output signal from the monitoring camera 70 is supplied to an image processing circuit 71. Although the CCD camera is used as the monitoring camera 70 in the embodiment, other types of cameras may be used instead.

An encoder 72 is provided at the counter-load side of the fifth motor M5 driving the carrier 3. Output pulses from the encoder 72 are supplied to a carrier position detecting circuit 73 which counts the output pulses from the encoder 72 to detect the position of the carrier 3 based on its count value. Furthermore, based on the count value, the carrier position detecting circuit 73 detects the timing that the nozzle 18 reaches the bottom dead point of the cycloid movement over the monitoring camera 70, thereby delivering a bottom dead point detection signal S1 to the image processing circuit 71. Upon receipt of the signal S1, the output signal from the monitoring camera 70 is simultaneously processed by the image processing circuit 71 so that an image of the position P of the nozzle 18 at the bottom dead point is provided. Visual information about the position P is input to a microcomputer 74 serving as control means. The microcomputer 74 then calculates amounts $\Delta X$ and $\Delta Y$ of deviation of the position P from a normal position 0 of the nozzle 18 at the bottom dead point or the position of original point. The amounts $\Delta X$, $\Delta Y$ of deviation of the position P are measured ten times for every nozzle 18, for example. Mean values of the amounts $\Delta X$, $\Delta Y$ are calculated by the microcomputer 74. The mean values of the amounts $\Delta X$, $\Delta Y$ are obtained since it is considered that the amounts $\Delta X$, $\Delta Y$ of deviation are distributed approximately uniformly in relatively small ranges as the result of periodic errors in the power transmission path of the carrier 3 or the like.

Figure 4:
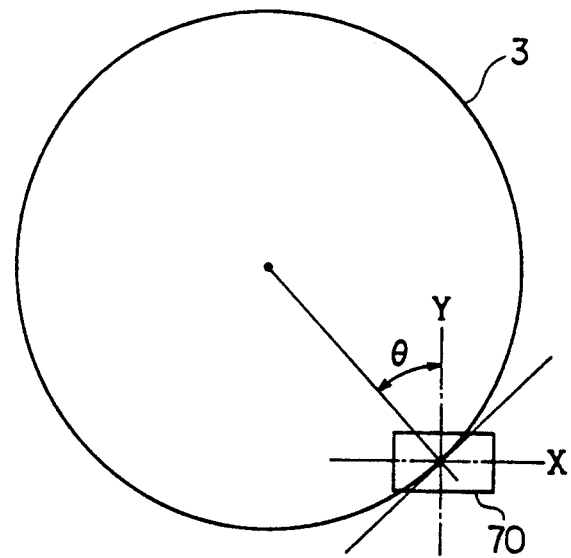
FIG. 4 is a plan view of the monitoring camera showing a positional relation between the monitoring camera and the rotating carrier.
Figure 5:
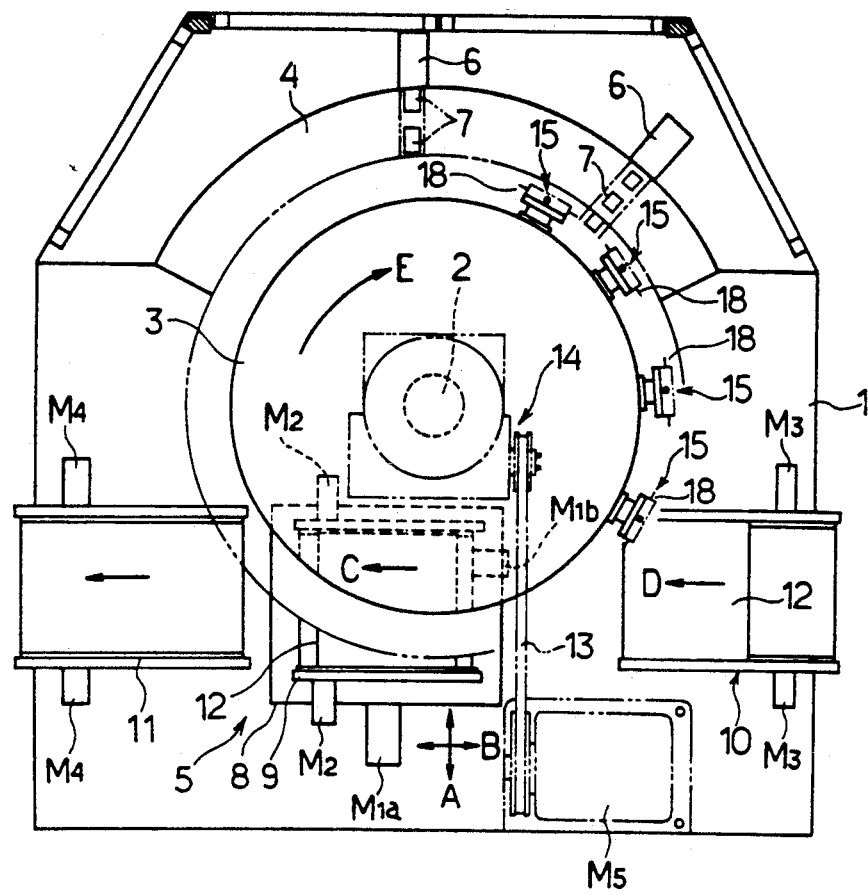
FIG. 5 is a schematic plan view of the parts mounting apparatus.

The sixth motor M6 also serves as a pulse motor for compensating the position of the nozzle 18 at the bottom dead point in the direction of the X-axis. A ninth motor M9 is provided for compensating the position of the nozzle 18 at the bottom dead point in the direction of the Y-axis. Based on the mean values of the amounts $\Delta X$, $\Delta Y$ of deviation, the microcomputer 74 calculates command values $C_x$ and $C_y$ to be supplied to the motors M6, M9 from the following equations (1) and (2), respectively:

$$C_x = \left( \sin^{-1} \frac{\cos\theta \cdot \Delta X}{R_s} \right) \cdot G_x \cdot P_x \cdot 2 \cdot \pi \quad (1)$$

$$C_y = \Delta Y \cdot G_y \cdot P_y \cdot \sin\theta \quad (2)$$

where $C_x$ is a cycloid phase shift pulse for compensation in the direction of the X-axis, $C_y$ is a linear drive pulse radial of the carrier for compensation in the direction of the Y-axis, $R_s$ is a radius of a circle of the cycloid movement, $G_x$ is a reduction ratio in the power transmission path for the X-axis, $G_y$ is a reduction ratio in the power transmission path for the Y-axis, $P_x$ is the number of pulses per revolution of the pulse motor M6, $P_y$ is the number of pulses per revolution of the pulse motor M9, and $\theta$ is an angle made by the Y-axis and the radius of the carrier 3 at the center of the monitoring camera 70 as shown in FIG. 4.

The command values $C_x$, $C_y$ calculated from the equations (1), (2) are input to drivers 75 and 76 so that the pulse motors M6, M9 are driven, respectively. The phase of the cycloid movement is compensated by the operation of the pulse motor M6 and each nozzle 18 is moved with the mounting head 15 by the pulse motor M9 so that the position of each nozzle 18 is modified radially of the carrier 3.

The microcomputer 74 controls all of the above-described motors M1-M9 and the operation of the valve 60.

FIG. 1 shows a control manner of the microcomputer 74 in the compensation of the position of the nozzle 18 at the bottom dead point. First, the carrier 3 is continuously rotated in the direction of arrow E. In this condition, the nozzle 18 directed downwards is turned in the counter-clockwise direction around the carrier 3 so that the nozzle 18 performs the cycloid movement in the direction of the outer periphery of the carrier 3, as is shown in FIG. 10 (step S1). Subsequently, the microcomputer 74 determines whether or not a bottom-dead-point detection signal $S_1$ has been generated by the carrier position detecting circuit 73 (step S2). The bottom-dead point detection signal $S_1$ is generated when the nozzle 18 reaches the bottom dead point of the cycloid movement. When the signal $S_1$ has been generated, the position of the nozzle 18 at the bottom dead point is photographed by the monitoring camera 70 (step S3).

Subsequently, the microcomputer 74 calculates the amounts $\Delta X$, $\Delta Y$ of deviation of the position P of the nozzle 18 from the normal position 0 or the position of original point (step S4). The microcomputer 74 determines whether or not the amounts $\Delta X$, $\Delta Y$ of deviation of the position P have been calculated ten times for every nozzle 18, for example (step S5). The above-described processing is repeated until the calculation is performed ten times.

The mean value of the amounts ΔX, ΔY of the deviation is calculated after the amount ΔX, ΔY has been calculated ten times for each nozzle 18 (step S6). Thereafter, the command values $C_x$, $C_y$ for the pulse motors M6, M9 are obtained from the equations (1), (2) respectively (step S7). The pulse motors M6, M9 are driven in response to the respective command values $C_x$, $C_y$ so that the position P of the nozzle 18 at the bottom dead point is compensated. The phase of the cycloid movement is compensated by operation of the pulse motor M6 so that the amount of deviation in the direction of the X-axis is modified. The nozzle 18 is moved radially of the carrier 3 by the pulse motor M9 so that the amount of deviation in the Y-axis is modified.

The above-described compensation of the position P of the nozzle 18 is repeated until an amount of compensation becomes approximately zero (allowable error or below). The compensation operation is completed when the amount of compensation becomes approximately zero (step S9).

Since the position P of the nozzle 18 is compensated with the nozzle 18 performing the cycloid movement as in the actual parts mounting operation, the precision in compensation of the position P can be improved.

Subsequently, the carrier 3 is driven in the mounting work so that the nozzle 18 performs the cycloid movement. When the nozzle 18 reaches the suction station 4 and reaches the bottom dead point of the cycloid movement at the position where the electronic part 7 is fed to the nozzle 18, the electronic part 7 is sucked into the lower end of the nozzle 18 at the bottom dead point. Since the position P of the nozzle 18 at the bottom dead point has been precisely compensated, failure in suction of the part 7 into the nozzle 18, defective mounting of the part and the like can be prevented.

In parallel with the suction operation, the substrates 12 are carried by the feed-in conveyor 10 in the direction of arrow D in FIG. 5 and loaded on the conveyor 9. Thereafter, the substrate 12 is carried to the center of the mounting station 5 by the conveyor 9, which is then stopped. Immediately after stop of the conveyor 9, the nozzle 18 reaches the bottom dead point of the cycloid movement over the center of the mounting station 5 (over the substrate 12) and the part 7 sucked in the lower end of the nozzle 18 is mounted on the substrate 12.

The nozzle 18 reaches the ground speed approximate to zero, at the bottom dead point of the cycloid movement. Accordingly, the suction and mounting of the part 7 can be stabilized.

The substrate 12 on which the part 7 has been mounted is carried by the conveyor 9 in the direction of arrow C in FIG. 5 and loaded on the feed-out conveyor 11 to be carried to a subsequent step.

Although the position P of the nozzle 18 at the bottom dead point is compensated in the directions of the X-axis and the Y-axis in the foregoing embodiment, only the compensation in the direction of the X-axis or compensation of the phase of the cycloid movement may be performed since the error in the direction of the Y-axis is small. Furthermore, the belt transmission mechanism in each of the power transmission paths 30, 35, 36 may be replaced by a gear transmission mechanism.

FIGS. 12 through 18 illustrate a second embodiment of the invention. In the second embodiment, the position of the part 7 sucked in the lower end of the nozzle 18 is monitored by the monitoring camera 70 so that the position of the nozzle 18 at the bottom dead point is compensated according to the monitored position of the part 7 sucked in the lower end of the nozzle 18, while in the previous embodiment, the position P of the nozzle 18 at the bottom dead point has been monitored by the monitoring camera 70. The control contents of the microcomputer 70 in the second embodiment differ from those in the first embodiment only in that the position of the part 7 is detected by the monitoring camera 70. The mechanical construction of the parts mounting apparatus and the control manner of the microcomputer after the detection of the position of the part 7 are the same as those in the first embodiment.

Figure 12:
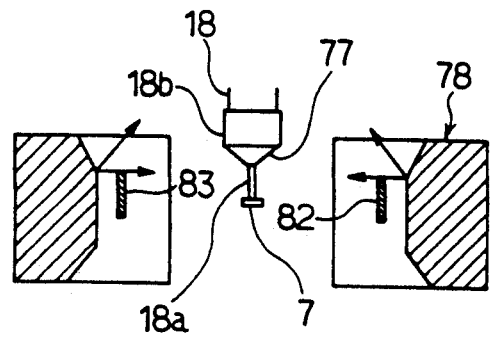
FIG. 12 schematically shows the positional relation among the nozzle, light source and monitoring camera in a second embodiment.
Figure 12:
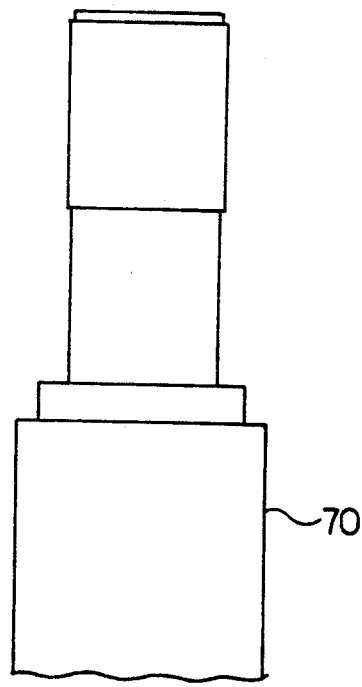

Referring to FIG. 12, diffuse reflection means 77 is provided on the distal end of the nozzle 18 for diffusely reflecting light. More specifically, a nozzle portion 18a is provided on the distal end of the suction nozzle 18. A conical portion 18b is formed integrally on the upper portion of the nozzle portion 18a. A paint is applied to the conical portion 18b for reflecting light incident to the conical portion 18b with a predetermined diffuse directing characteristic. The portion of the conical portion to which the paint is applied serves as the diffuse reflection means 77.

Figure 13:
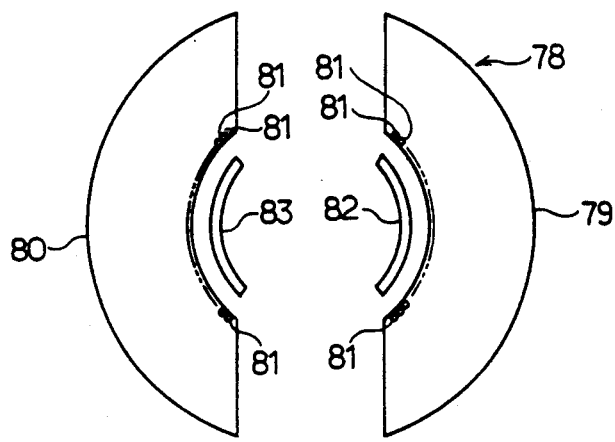
FIG. 13 is a plan view of the light source.

A light source 78 is provided over the monitoring camera 70. FIG. 13 shows the plan view of the light source 78. The light source 78 comprises a number of optical fibers 81 concentrically disposed on the inner peripheral faces of curved members 79 and 80. Light from a strobe (not shown) is incident to the optical fibers 81. Shielding members 82 and 83 are provided to face the inner peripheral faces of the curved members 79, 80 respectively. The light from the optical fibers 81 is prevented by the shielding members 82, 83 from being radiated to the sucked electronic part 7. See FIG. 12. The nozzle 18 is adapted to move between the curved members 79, 80. An angle of inclination of the diffuse reflection means with respect to the axis of the nozzle 18 and the position of the light source 78 with respect to the nozzle 18 will be determined as will be described later.

After the part 7 is sucked by the nozzle 18 at the suction station 4, the strobe is activated when the nozzle 18 reaches the bottom dead point, so that light is radiated from the light source 78. Consequently, the light from the light source 78 is incident to the diffuse reflection means 77 and is reflected on the diffuse reflection means 77. Since the optical fibers 81 of the light source 78 are annularly disposed, the light radiated from each optical fiber 81 can be considered a point light source.

Figure 14:
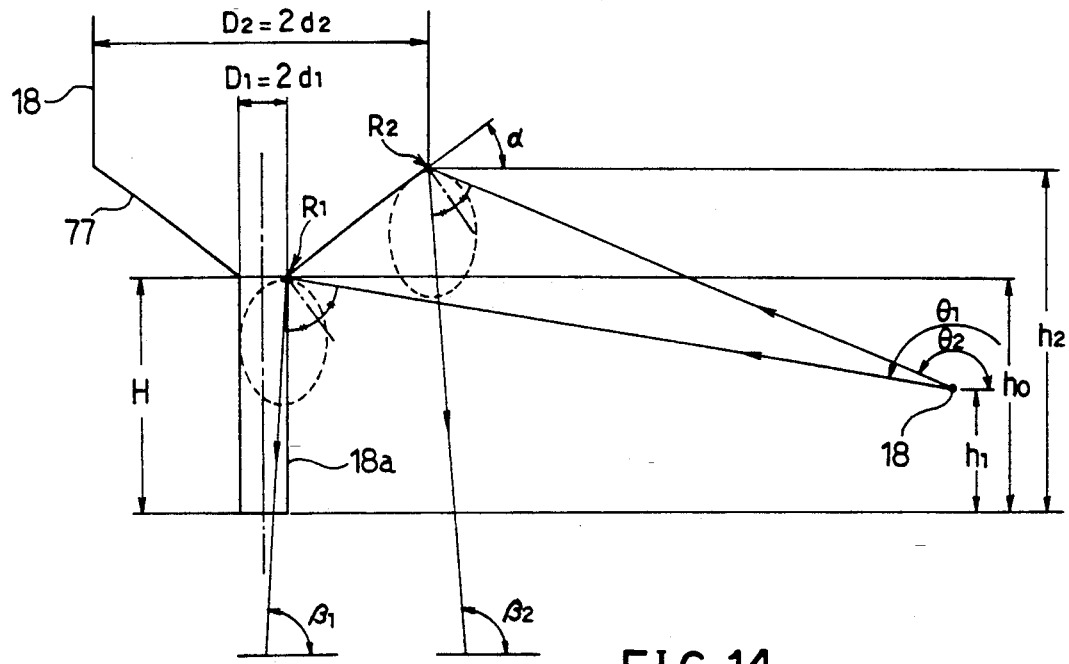
FIG. 14 shows the positional relation between the nozzle and the light source.

FIG. 14 illustrates a path of the light radiated from the light source 78 and a path of the light reflected on the diffuse reflection means 77. Of the light in the regular reflection by the diffuse reflection means 77, that radiated in the direction having the largest inclination from the axis of the nozzle portion 18a is the regular reflection light reflected on the end of the diffuse reflection means 77, as shown by arrows R1 and R2 in FIG. 14. Even when the regular reflection light reflected on the end of the diffuse reflection means 77 is not incident to the monitoring camera 70, the light reflected on the diffuse reflection means 77 is reflected in accordance with the diffuse directing characteristic of the means 77 such as shown by the broken line in FIG. 14. Accordingly, when the light reflected axially of the nozzle 18 has such an intensity that the part 7 can be photographed by the monitoring camera 70, the position of the part 7 with respect to the nozzle portion 18a can be detected from the result of photographing by the monitoring camera 70. Thus, the angle of inclination of the diffuse reflection means 77 with respect to the axis of the nozzle portion 18a and the position of the optical fibers 81 with respect to the nozzle portion 18a are obtained so as to satisfy the above-described relationship.

Figure 15:
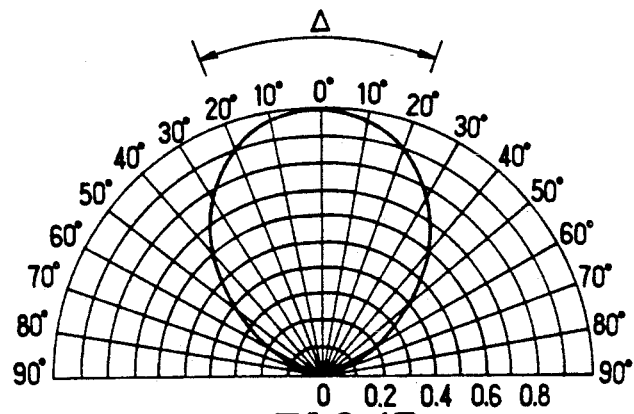
FIG. 15 shows a diffusely directional characteristics of the diffuse reflection means.

FIG. 15 shows one example of the diffuse directing characteristic of the diffuse reflection means 77 or more specifically, a ratio of the light intensity to the maximum amount of light (regular reflection light) reflected on the diffuse reflection means 77 in terms of the angle of reflection. The monitoring camera 70 needs to receive the effective reflected light reflected on the whole of the diffuse reflection means 77. Now, consider the case where $\beta_1$ is a light-receiving angle of the camera 70 for the regular reflected light at the end R1 of the diffuse reflection means 77 and $\beta_2$ is a light-receiving angle of the camera 70 for the regular reflected light at the end R2 of the means 77. The diffuse reflection means 77 can receive the effective reflected light when $\beta_1$ is $(90° - \Delta/2)$ or above and $\beta_2$ is $(90° + \Delta/2$ or below where $\Delta$ is a directing angle of the effective reflected light with which an image can be picked up by the monitoring camera 70.

The values of $\beta_1$, $\beta_2$ are obtained from FIG. 14:

$$\beta_n = (180 - \theta_n) + 2\alpha$$

where n = 1, 2, ...
and $$\beta_n = 180 - \arctan \frac{h_n - h_0}{L - d_n}$$

where n = 1, 2, ... Since $$h_1 = H$$

and $$h_2 = H + (d_2 - d_1)\tan\alpha$$

where $D1(=2d_1)$ is the diameter of the nozzle portion 18a, $D2(=2d_2)$ the diameter of the diffuse reflection means 77, $H(=h_0)$ the length of the nozzle portion 18a, L the distance from the center of the nozzle portion 18a to the optical fibers 81, h1 the height from the distal end of the nozzle portion 18a to the optical fibers 81, and h2 the height from the distal end of the nozzle portion 18a to the end R2 of the diffuse reflection means 77, $$\beta_1 = 2\alpha + \arctan \frac{H - h_0}{L - d_1}$$

and $$\beta_2 = 2\alpha + \arctan \frac{H + (d_2 - d_1)\tan\alpha - h_0}{L - d_2}$$

Accordingly, the values of $\beta_1$, $\beta_2$ are obtained from the above equations in accordance with $\beta_1 = 90° + \Delta/2$ and $\beta_2 = 90° - \Delta/2$.

Figure 16:
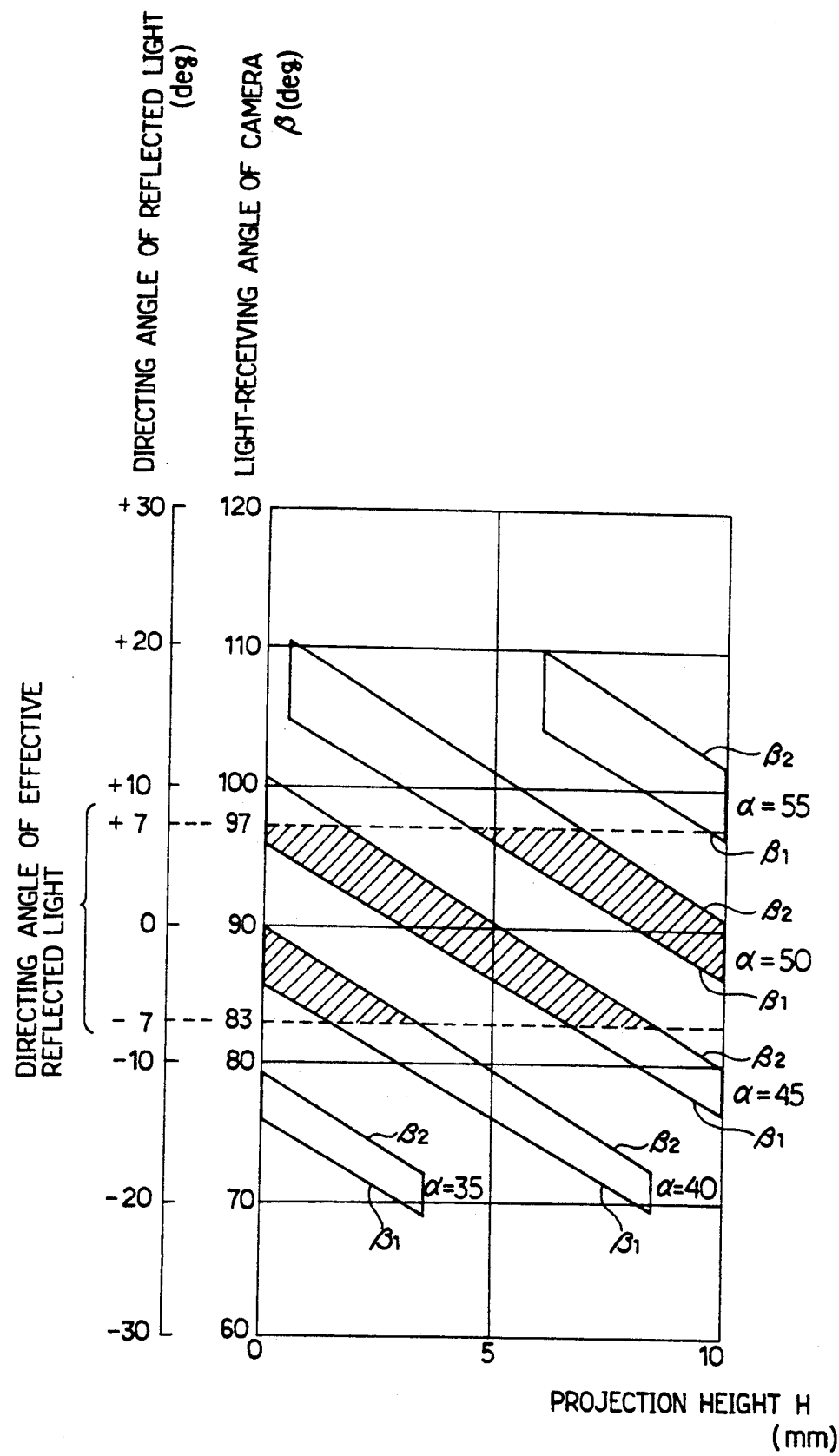
FIG. 16 is a graph showing the characteristics of the light-receiving angle of the CCD camera.
Figure 17:
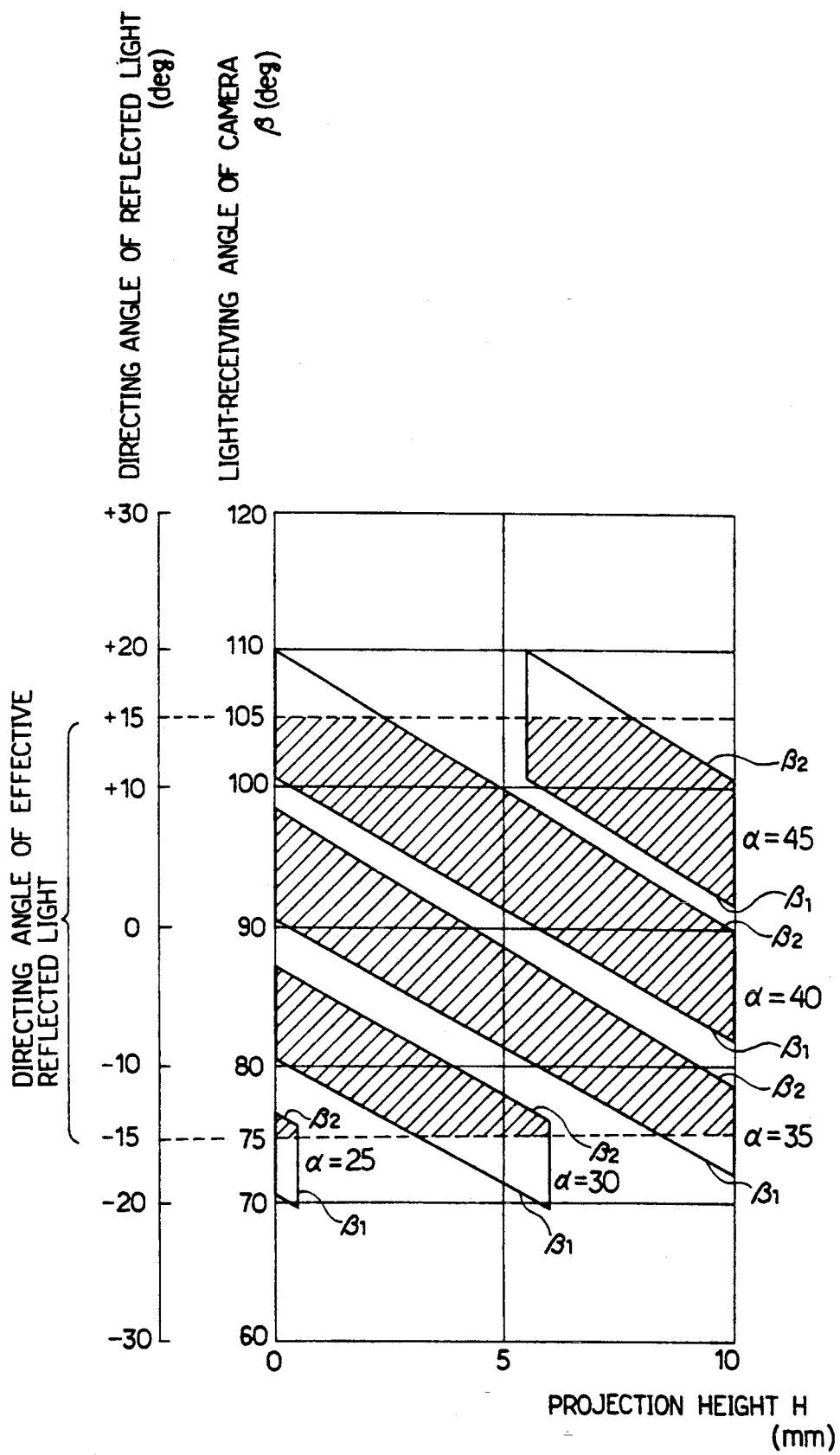
FIG. 17 is a graph similar to FIG. 16 in the different condition.

FIGS. 16 and 17 show the values of $\beta_1$ and $\beta_2$ depending upon the inclination angle $\alpha$ of the diffuse reflection means 77 with respect to the axis of the nozzle portion 18a and the height H from the distal end of the nozzle portion 18a to the light source 78 when the diameter D1 and the length H of the nozzle portion 18 and the diameter D2 of the means 77 are set at respective predetermined values. In FIG. 16, the diameter D1 and the length H of the nozzle portion 18a are set at 0.71 mm and 3 mm respectively and the diameter D2 of the means 77 is set at 5 mm. In this case, the light-receiving angle $\beta$ of the monitoring camera 70 needs to be set at $(90° \pm 7°)$ when the directing angle of the effective light reflected by the diffuse reflection means 77 is about $\pm 7$ degrees, for example. Accordingly, in order that $\beta_1$ is 83° or above and $\beta_2$ is 97° or below, the inclination angle $\alpha$ of the means 77 with respect to the nozzle portion 18a and the height $h_1$ from the distal end of the nozzle portion 18a to the light source 78 need to be set at such values that range in the oblique-line regions. As the result of such a setting of $\alpha$ and $h_1$ as described above, the light reflected by the means 77 to be received by the camera 70 has a sufficient amount for the camera 70 to perform the image pick-up processing.

In FIG. 17, the diameter D1 and the length H of the nozzle portion 18a are set at 1.3 mm and 11 mm respectively and the diameter D2 of the diffuse reflection means 77 is set at 9 mm. In this case, the light-receiving angle of the monitoring camera 70 needs to be set at $(90° \pm 30°)$ when the directing angle $\Delta$ of the effective light reflected by the means 77 is about $\pm 30°$, for example. Accordingly, the inclination angle $\alpha$ of the means 77 with respect to the nozzle portion 18a and the height $h_1$ from the distal end of the nozzle portion 18a to the light source 78 are set at respective values ranging in the oblique-line regions in FIG. 17.

FIGS. 16 and 17 show the cases where no optical fiber is missing. When some fibers 81 are missing, the distance L from the nozzle portion 18a to the light source 78 is increased so that an influence of the missing of the fibers can be evaded.

In accordance with the above-described construction, the inclination angle $\alpha$ of the diffuse reflection means 77 with respect to the nozzle portion 18a and the height H from the distal end of the nozzle portion 18a to the light source 78 are so set that the monitoring camera 70 receives the effective reflected light with which the image can be picked up by the camera 70. The present invention thus differs from the prior art wherein the diffuse reflection plate is mounted so as to intersect perpendicularly to the nozzle. Consequently, the position of the electronic part 7 can be precisely detected based on the position of the image of the part 7 picked up by the monitoring camera 70.

It is desirable that the effective reflection angle of the diffuse reflection means 77 is zero. In order to achieve this, the diffuse reflection means 77 needs to have a curved reflection surface. However, the effective reflection angle $\Delta$ is set at the predetermined value in the foregoing embodiment such that the inclination angle of the diffuse reflection means 77 with respect to the nozzle portion 18a can be set linearly. Consequently, the diffuse reflection means 77 can be formed readily.

Although the diffuse reflection means 77 is conical in the foregoing embodiment, it may be formed to have a reflection surface whose inclination angle can be set at different values. Furthermore, the diffuse reflection means 77 may have a curved reflection surface.

Figure 18:
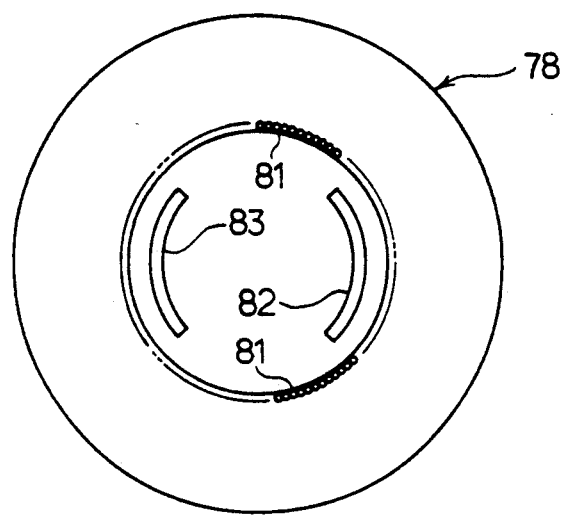
FIG. 18 is a view similar to FIG. 13 showing a third embodiment.

The diffuse reflection means 77 may be independent from the nozzle 18. Although the light source 78 is semicircular in the foregoing embodiment, it may comprise the optical fibers 81 disposed annularly as shown in FIG. 18.

The foregoing disclosure and drawings are merely illustrative of the principles of the present invention and are not to be interpreted in a limiting sense. The only limitation is to be determined from the scope of the appended claims.

We claim:

1. A parts mounting apparatus comprising:
   a) a rotating carrier having a reference plane and rotated about a rotational shaft perpendicular to the reference plane;
   b) a suction nozzle mounted on an outer periphery of the rotating carrier to be turned in a direction intersecting substantially perpendicularly to the reference plane, the nozzle performing a cycloid movement when turned with rotation of the rotating carrier, the nozzle having a distal end having a plurality of bottom dead points in the cycloid movement;
   c) control means for controlling the nozzle so that the nozzle performs a suction operation in which a part is sucked into the distal end of the nozzle when the distal end of the nozzle reaches a predetermined one of the bottom dead points and so that the nozzle releases the suction operation when the distal end of the nozzle reaches the other or another predetermined bottom dead point;
   d) a monitoring camera positioned at one of the plurality of dead points for monitoring the distal end of the nozzle during the cycloid movement of the nozzle;
   e) operating means for obtaining an amount of deviation of the distal end of the nozzle from a bottom dead point from output information from the monitoring camera; and
   f) compensation means for compensating a phase of the cycloid movement so that the amount of deviation of the distal end of the nozzle from a bottom dead point is zeroed.

2. A parts mounting apparatus according to claim 1, wherein a plurality of suction nozzles are mounted on the outer periphery of the rotating carrier to be arranged radially in the direction intersecting substantially perpendicularly to the reference plane of the rotating carrier, instead of one nozzle.

3. A parts mounting apparatus according to claim 2, wherein the nozzles have different nozzle diameters from one another.

4. A parts mounting apparatus according to claim 1, wherein the operating means obtains, as the amount of deviation, a means of a plurality of values of the deviation of the distal end of the nozzle from a bottom dead point.

5. A parts mounting apparatus according to claim 1, wherein the operating means obtains the amount of deviation of the distal end of the nozzle from a bottom dead point only in a traveling direction of the cycloid movement of the nozzle.

6. A parts mounting apparatus according to claim 1, wherein the monitoring camera comprises a charge coupled device (CCD) camera.

7. A parts mounting apparatus comprising:
   a) a rotating carrier having a reference plane and rotated about a rotational shaft perpendicular to the reference plane;
   b) a suction nozzle mounted on an outer periphery of the rotating carrier to be turned in a direction intersecting substantially perpendicularly to the reference plane, the nozzle performing a cycloid movement when turned with rotation of the rotating carrier, the nozzle having a distal end having a plurality of bottom dead points in the cycloid movement;
   c) control means for controlling the nozzle so that the nozzle performs a suction operation in which a part is sucked into the distal end of the nozzle when the distal end of the nozzle reaches a predetermined one of the bottom dead points and so that the nozzle releases the suction operation when the distal end of the nozzle reaches the other or another predetermined bottom dead point;
   d) a monitoring camera positioned at one of the plurality of dead points for monitoring the part sucked in the distal end of the nozzle during the cycloid movement;
   e) operating means for obtaining an amount of deviation of the part sucked in the distal end of the nozzle from a bottom dead point from output information from the monitoring camera; and
   f) compensation means for compensating a phase of the cycloid movement so that the amount of deviation of the distal end of the nozzle from a bottom dead point is zeroed.

8. A parts mounting apparatus according to claim 7, further comprising diffuse reflection means provided on an upper distal end of the nozzle for reflecting an incident light with predetermined diffusely directional characteristic and a light source provided for projecting light onto the diffuse reflection means and positioned so that an effective reflected light having a large reflective intensity out of the light reflected by the diffuse reflection means is allowed to enter the monitoring camera.

9. A parts mounting apparatus according to claim 8, wherein an angle of inclination of the diffuse reflection means with respect to the nozzle and a position of the light source with respect to the nozzle are so determined that a light-receiving angle $\beta$ of the monitoring camera receiving the effective reflected light out of the light diffusely reflected by the diffuse reflection means is show by the following equation:

$$\beta = 90° \pm \Delta/2 \text{ (degree)}$$

where $\Delta$ (degree) is an angle of diffuse direction of the effective reflected light diffuse reflected by the diffuse reflection means.

10. A parts mounting apparatus according to claim 7, wherein the diffuse reflection means is mounted integrally on the nozzle.

11. A parts monitoring apparatus according to claim 7, wherein the monitoring camera comprises a charge coupled device (CCD) camera.

12. A parts mounting apparatus according to claim 7, wherein the light source comprises a plurality of point light sources arranged annularly about a bottom dead point.

13. A parts mounting apparatus according to claim 7, further comprising an interrupting member interrupting an optical path extending from the light source tot he part sucked in the distal end of the nozzle.

* * * * *

UNITED STATES PATENT AND TRADEMARK OFFICE
CERTIFICATE OF CORRECTION

PATENT NO. : 5,285,888

DATED : February 15, 1994

INVENTOR(S) : Takatomo Izume, Urawa; Shuji Sato, Yokkaichi; Shingo Sekiguchi, Haciohji; Katasuya Sano, Kuwana; Hisao Suzuki; Kazuhiro Tokitu, both of Tokyo, all of Japan It is certified that error appears in the above-identified patent and that said Letters Patent is hereby corrected as shown below:

On the title page, item [73] Assignee: Should read--

KABUSHIKI KAISHA TOSHIBA
KANAGAWA-KEN, JAPAN

TOSHIBA ENGINEERING CORPORATION
KAWASAKI-SHI, KANAGAWA-KEN JAPAN

JAPAN TOBACCO INC.
SHINAGAWA-KU, TOKYO 140, JAPAN

--.

Signed and Sealed this

Eleventh Day of October, 1994

Attest:

BRUCE LEHMAN

*Attesting Officer*  *Commissioner of Patents and Trademarks*